United States Patent [19]

Kwon

[11] Patent Number: 5,200,809
[45] Date of Patent: Apr. 6, 1993

[54] EXPOSED DIE-ATTACH HEATSINK PACKAGE

[75] Inventor: Young I. Kwon, San Jose, Calif.

[73] Assignee: VLSI Technology, Inc., San Jose, Calif.

[21] Appl. No.: 767,171

[22] Filed: Sep. 27, 1991

[51] Int. Cl.$^5$ .............................................. H05K 7/20
[52] U.S. Cl. ..................................... 257/707; 361/386; 257/712; 257/720
[58] Field of Search ............................. 357/72, 74, 81; 361/386

[56] References Cited

U.S. PATENT DOCUMENTS

| | | | |
|---|---|---|---|
| 3,585,272 | 6/1971 | Shatz | 357/72 |
| 3,636,415 | 1/1972 | Kruer | 357/74 |
| 3,930,114 | 12/1975 | Hodge | 357/72 |
| 5,065,280 | 11/1991 | Karnezos et al. | 357/81 |

FOREIGN PATENT DOCUMENTS 2-306639 12/1990 Japan.

Primary Examiner—Eugene R. LaRoche
Assistant Examiner—Viet Q. Nguyen
Attorney, Agent, or Firm—Hickman & King

[57] ABSTRACT

A technique for packaging an integrated-circuit die in a conventional molded-plastic package exposes the lead frame to which the integrated-circuit die is attached so that heat-conducting columns can be directly attached to the leadframe through vias formed in the molded plastic package. The vias expose selected areas of the lead-frame to which are attached the thermally conductive columns, which extend to an exterior surface of the molded plastic package so that the lead-frame and the conductive columns provide a path for conduction of heat from the die to the exterior of the package.

10 Claims, 3 Drawing Sheets

EXPOSED DIE-ATTACH HEATSINK PACKAGE

BACKGROUND OF THE INVENTION

1. Field of the Invention

This invention relates to techniques for cooling integrated circuits and more particularly for cooling integrated circuits packaged in molded plastic packages.

2. Prior Art

Historically, integrated-circuit dies have tended to decrease in area, while the number of transistors contained on an integrated-circuit die have tended to increase. As a consequence, additional cooling is sometimes needed in order to keep the temperature of the integrated-circuit devices within safe limits. Previously, to obtain increased cooling efficiency for integrated circuits packaged in conventional molded plastic packages, an external add-on heatsink was fixed to an exterior surface of a standard molded plastic package. This add-on heatsink changes the profile of the standard integrated circuit package and in many cases requires mechanical redesign of the circuit board on which the integrated-circuit package is installed.

A need exists for improving the heat and thermal performance for integrated circuits packaged in conventional molded plastic packages, while at the same time maintaining the standard package profiles of these conventional plastic packages.

SUMMARY OF THE INVENTION

It is therefor an object of the invention to provide higher thermal performance for an integrated circuit packaged in a conventional molded plastic package having a standard profile.

In accordance with this and other objects of the invention, a packaging technique is provided which provides vias in the body of the package to expose the lead frame to which an integrated-circuit is attached so that a heat conducting column can be directly attached to the leadframe and conduct heat away from the die.

A fundamental concept of the invention is to provide a more direct heat-conduction path from an integrated-circuit die to the ambient air, while maintaining a conventional molded-plastic package outline. Consequently, the invention enables the same manufacturing process flows and process equipment to be used with the integrated-circuit package arrangement provided in accordance with the invention. Improved thermal performance is be obtained for a given molded-plastic package configuration without the necessity for large capital investment in manufacturing processes or equipment.

A package arrangement according to the invention includes an integrated circuit die contained in a molded plastic package. A lead-frame is provided which has a die-attach paddle to which the integrated-circuit die is attached. A plastic package is molded around the lead-frame and has one or more vias formed therein for respectively exposing one or more selected areas of the lead-frame. One or more thermally conductive column members are each respectively attached to a respective one of the exposed areas of the lead-frame. Each of the thermally conductive columns extends to an exterior surface of the plastic package so that the lead-frame and the conductive columns provide a path for conduction of heat from the die to the exterior of the package.

The head-conduction columns are attached to the lead frame in a number of ways, including soldering, adhesive bonding, and fastening with screws. Various heatsink/heat dissipator devices are attached to the ends of the heat-conduction columns provided by the invention to provide additional heat transfer capabilities to a molded plastic package having a standard profile.

The invention provides a method for cooling an integrated circuit die contained in a conventional molded-plastic package. An integrated-circuit die is attached to a die-attach paddle of a lead-frame and a plastic package is molded around the lead-frame. The molding step includes forming one or more vias in the molded plastic package to expose selected areas of the lead-frame. Thermally conductive column members are attached to respective exposed areas of the lead-frame. Each of the thermally conductive column members extends to an exterior surface of the plastic package and conducts head from the die to the exterior of the package.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
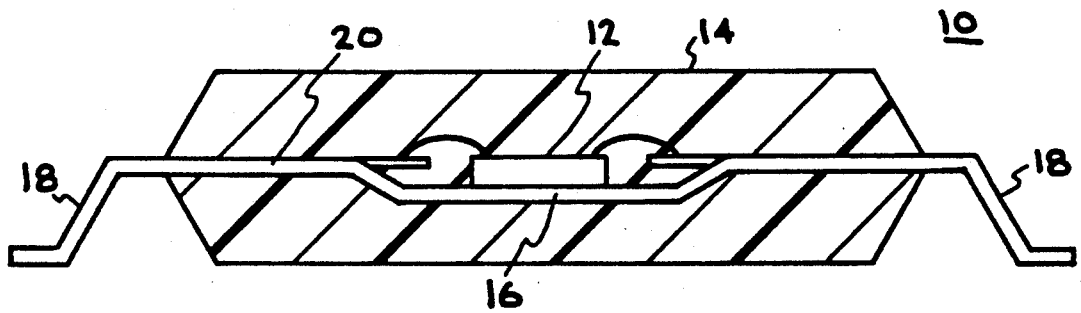
FIG. 1 is a cross-sectional view of a conventional molded-plastic package for an integrated circuit.

FIG. 1 shows a conventional package arrangement 10 for an integrated-circuit die 12 contained within a conventional molded-plastic body 14 having a standard profile and produced by manufacturing processes and equipment known in the integrated-circuit manufacturing art. The die 12 is mounted to a die-attach paddle portion 16 of a leadframe 18. Heat from the die 12 is conducted to the ambient air through the molded plastic material of the body 14 and through the leads 18 of the leadframe 20. Removal of heat form the integrated-circuit die in this manner limits the rate at which heat can be removed from the die.

Figure 2:
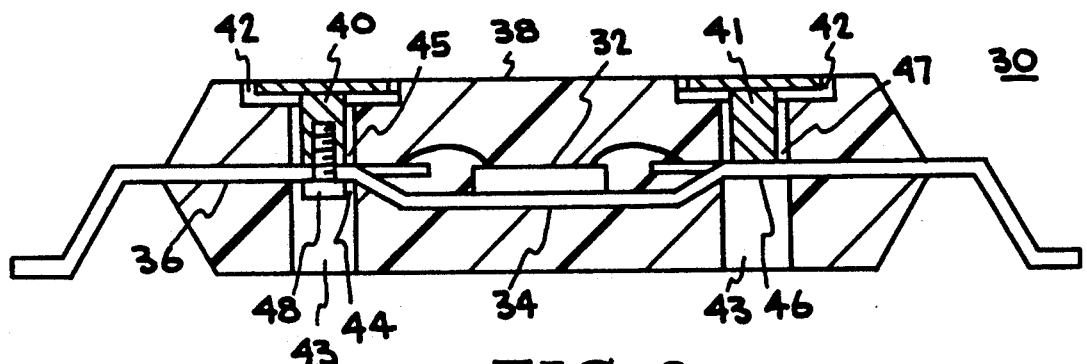
FIG. 2 is a cross-sectional view of a molded plastic package having a direct heat-conduction path from the integrated circuit die to the exterior surface of the package through a plurality of heat columns.

FIG. 2 shows an embodiment of the invention in which a molded plastic package arrangement 30 is provided which has the same package outline as the conventional molded plastic package 10 of FIG. 1. This package arrangement 30 provides a direct heat-conductive path between an integrated circuit die 32, which is mounted on a die-attach paddle portion 34 of a leadframe 36, and the exterior surface of a molded-plastic body 38 using a plurality of thermally conductive head columns (typically shown as 40,41).

The molded-plastic body 38 of the package is molded using conventional molding techniques. The molds are designed to leave a plurality of vias, or passages, 42,43 which extend through the top and bottom portions of the molded plastic body 38 to provide predetermined exposed areas (typically shown as 44,45 and 46,47) on the top and bottom surfaces of the leadframe 36 in the molded package. The thermally conductive head columns 40,41 are formed of a thermally conductive material, such as a metal. The vias 42 are shown with a larger cross-section near the top surface of the body 38 of the package to accommodate the enlarged heads of the thermally conductive heat columns 40,41.

The thermally conductive heat columns 40,41 are attached to the leadframe 36 in several ways. For example, as illustrated in FIG. 2, the heat conductive column 40 is connected to the surface 45 of the leadframe 36 using a screw 48. The screw extends from the via 43 through a hole in the leadframe 36 and into a threaded bore in the heat conductive column 40 FIG. 2 alternatively shows the heat conductive column 41 fixed to the exposed surface 47 of the leadframe 36 with a number of materials, such as for example, solder or adhesives such as epoxy or polyimide materials.

Note that the integrated-circuit die 32 remains sealed within the plastic material of the body 38, providing similar protection as a package without vias.

Figure 3:
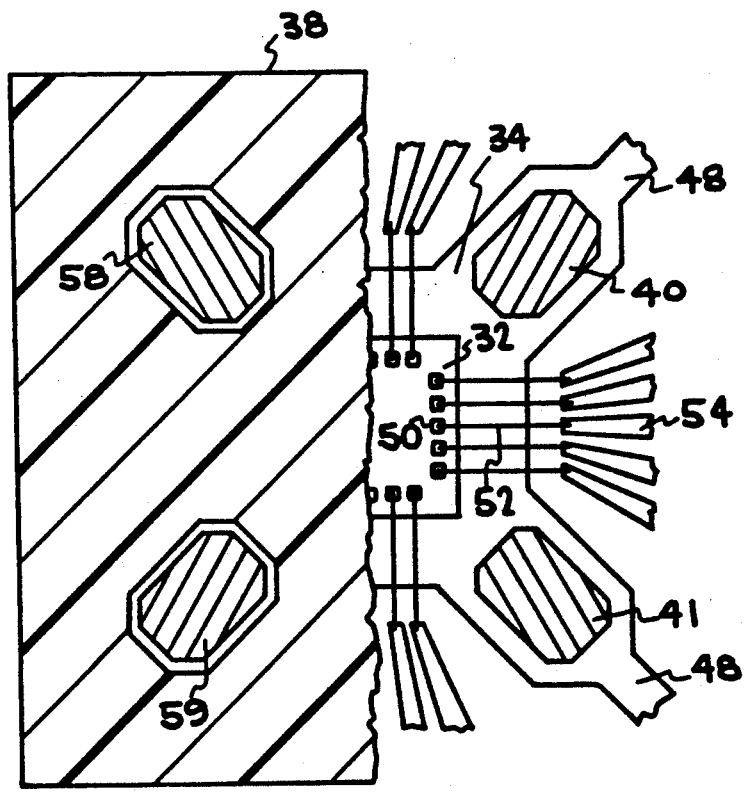
FIG. 3 is top, partially sectional, view of a molded plastic package having a plurality of heat conductive columns connected to the lead frame of an integrated circuit.

FIG. 3 shows a top, partially sectional, view of the molded plastic package arrangement of FIG. 2, where two additional heat conductive columns 58,59 are shown extending to the top exterior surface of the package body 38. The heat conductive columns 40, 41 are shown connected to modified tie bars 48 extending from the corners of the die-attach paddle 34 of the lead frame 36. FIG. 3 typically shows the die 32 with a wire-bonding pad 50 connected by a bonding wire 523 to a respective wire-bonding finger 54 of the lead frame 36.

A method is provided according to the invention for cooling an integrated circuit die contained in a molded plastic package and attached to a die-attach paddle of a leadframe. A plastic package is molded around the leadframe. The molding step includes forming one or more vias in the molded plastic package to expose one or more selected portions of the lead-frame. One or more thermally conductive column members are attached to respective exposed portions of the lead-frame and each of the thermally conductive column members extends to an exterior surface of the molded plastic package. Heat is conducted from the die to the exterior of the package through the leadframe and through the thermally conductive column members.

Figure 4:
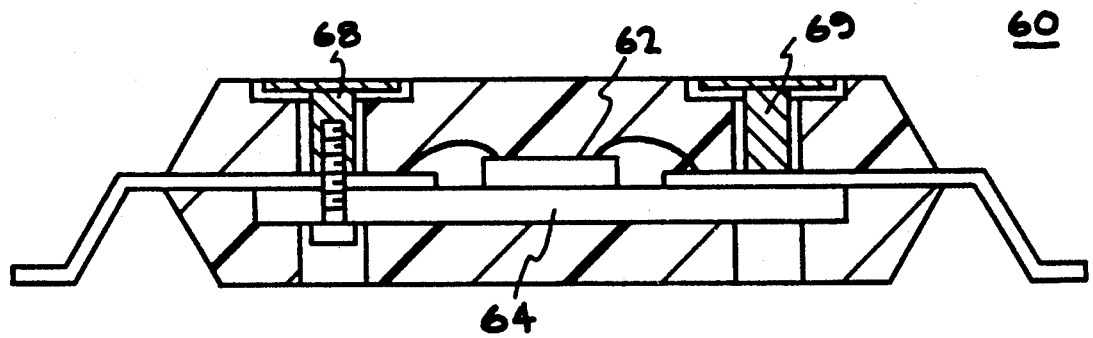
FIG. 4 is a cross-sectional view of a molded plastic package for an integrated-circuit having a separate die-attach pad to increase heat transfer from the integrated-circuit died to the heat conductive columns.

FIG. 4 is a cross-sectional view of a molded plastic package arrangement 60 for an integrated-circuit die 62. This arrangement is similar to the arrangement shown in FIG. 2. The package arrangement 60 includes a separate die-attach pad, or plate, 64 to which the die 62 is attached and to which a leadframe 66 is attached. The plate 64 is thicker than the conventional die-attach portion of a standard lead frame to increase heat transfer from the die 62 to the heat conduction columns 68,69.

The invention provides a direct heat-conduction path between a die and the exterior of the package body. Various techniques are available for conducting heat from the ends of the heat-conduction columns to the ambient. One of these techniques is to arrange the integrated-circuit package so that the top surface of the package and the ends of the heat-conduction columns face a circuit board, which has heat-spreader traces formed thereupon for improved heat transfer to the ambient. Other techniques for conducting head from the ends of the heat-conduction columns to the ambient are shown in connection with FIG. 5,6 and 7.

Figure 5:
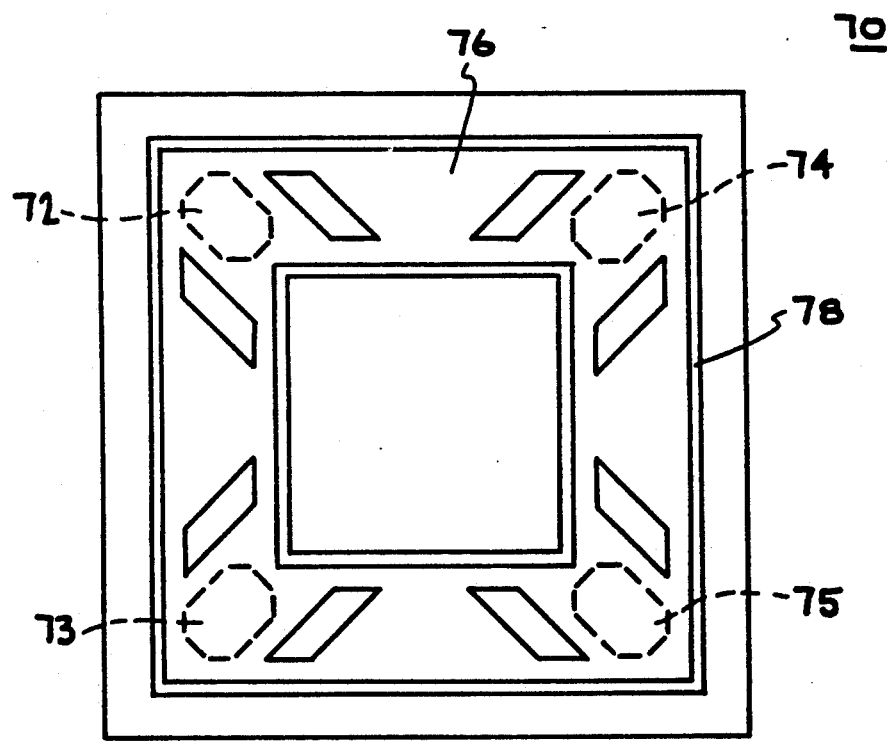
FIG. 5 is a top view of a molded plastic integrated-circuit package having a plurality of heat conductive columns attached to a flat radiative plate-ring recessed into the package with with louvers formed in the plate for convection cooling.

FIG. 5 is a top view of an alternative molded plastic integrated-circuit package arrangement 70, which has a plurality of heat conductive columns 72,73,74,75 each respectively attached near a corner of the die-attach paddle of the leadframe. The top surfaces of the columns 72,73,74,75 are attached near the corners of a rectangular heat-sink plate 76. The heat-sink plate fits within a recessed are 78 molded into the top of the package body 80. The center potion of the plate 76 is cutout. A plurality of slots, or louvers, are formed in the plate 76 to provide for convection cooling of the area beneath the plate 76.

Figure 6:
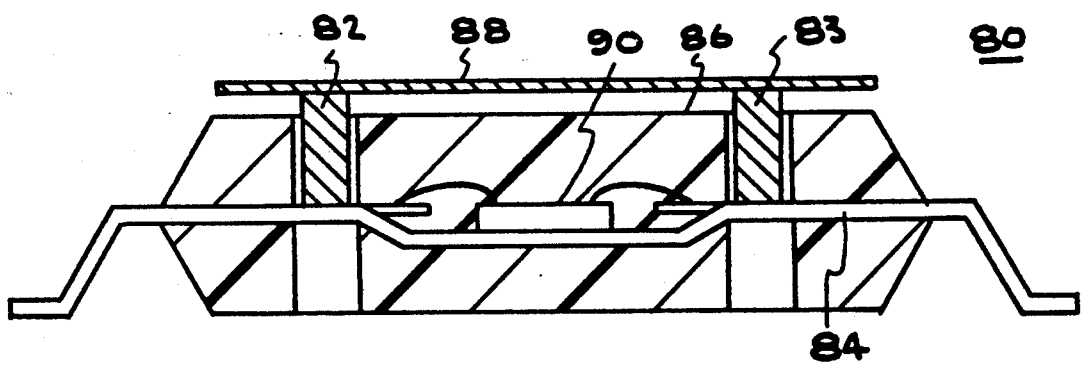
FIG. 6 is a cross-sectional view of a molded plastic package for an integrated circuit which uses heat conductive columns attached to an external head sink/-spreader plate.

FIG. 6 shows a cross-sectional view of a plastic integrated-circuit package arrangement 80, which includes heat conductive columns 82,83 which are attached to exposed areas of a leadframe 84 and which extend through the body 86 of the package so that the top ends of the columns 82,83 extend above the top surface of the body 86 of the package arrangement 80. Attached to the ends of the columns 82,83 is an external heatsink/heatspreader plate 88. The plate 88 aids in removal of heat transmitted from an integrated-circuit die 90 through the die-attach paddle of the leadframe 84 and through the heat conduction columns 82,83.

Figure 7:
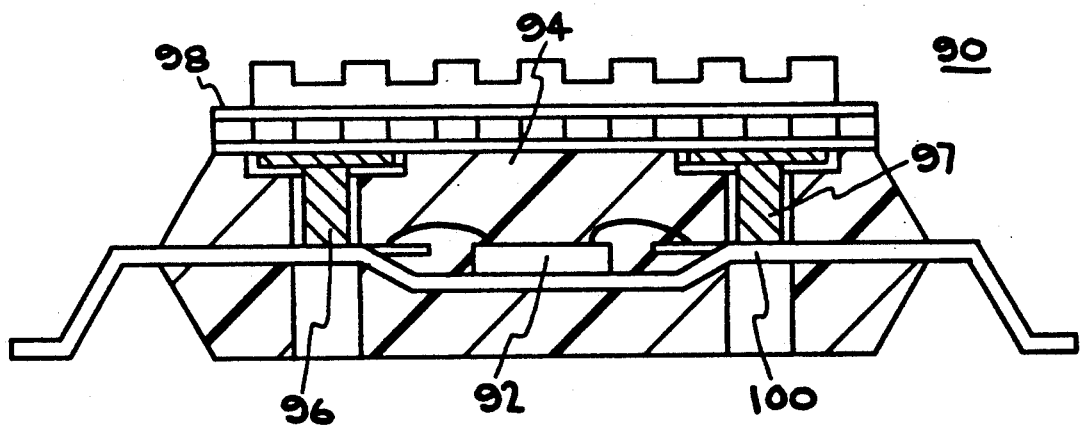
FIG. 7 is a is a cross-sectional view of a molded plastic package for an integrated circuit which uses heat conductive columns attached to an external thermo-electric device to provide high performance active cooling of the integrated circuit.

FIG. 7 is a cross-sectional view of another molded-plastic package arrangement 90 for improved cooling of an integrated circuit die 92 contained within a conventional molded-plastic body 94. Heat conductive columns 96,97 are attached to exposed areas of a leadframe 98 and extend through vias formed in the body 94 of the package. The top ends of the columns 96,97 extend to the top surface of the body 94. Attached to the enlarged ends of the columns 96,97 is a thermoelectric cooling device, or heat pump, 98 which provides high-performance active cooling to the ends of the columns 96,97 and the top surface of the body 94 of the package when appropriate electrical power is applied thereto. The thermoelectric cooling device 98 aids in removal of heat from the integrated-circuit die 92 through the die-attach paddle of a leadframe 100 and through the heat conduction columns 96,97.

The various heatsinks/heatspreaders connected to the exterior ends of the head-conductive columns can be segmented into various separate units, depending upon the space limitations associated with a particular application.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. Apparatus for cooling an integrated circuit die contained in a molded plastic package, comprising:
   a lead-frame having a die-attached paddle to which an integrate-circuit die is attached;
   a molded package, which is formed of plastic material and which is molded around said lead-frame to which said integrated-circuit die is attached, said molded package having one or more passages formed therein for respectively exposing one or more predetermined portions of the lead-frame;
   one or more thermally conductive column members, each respectively attached at one end to a respective one of said selected exposed portions of said lead-frame, each of said one or more thermally conductive column members extending through a passage formed in said molded package to an exterior surface of said molded package and, together with the lead-frame, providing a path for conduction of heat from the integrated-circuit die to the other end of each of said one or more thermally conductive column members at the exterior of the molded package.

2. The apparatus of claim 1 wherein said thermally conductive column members are formed of metal material.

3. The apparatus of claim 1 wherein the thermally conductive column members are attached to the lead-frame with an adhesive material.

4. The apparatus of claim 1 wherein the thermally conductive column members are attached to the lead-frame with a solder bond.

5. The apparatus of claim 1 wherein the thermally conductive column members are attached to the lead-frame with a screw-fastener.

6. The apparatus of claim 1 wherein the die-attach paddle includes a separate heat-conductive plate member to which the die and the leadframe are attached.

7. The apparatus of claim 1 further including a heatsink/spreader plate which is attached to the other ends of said one or more thermally conductive column members at the exterior surface of said molded package.

8. The apparatus of claim 7 wherein the heatsink/spreader plate includes louvers formed in the heatsink/spreader plate to provide for increased convention cooling.

9. The apparatus of claim 7 wherein the heatsink/spreader plate includes a thermo-electric heat pump.

10. The apparatus of claim 1 wherein the one or more selected exposed portions of the lead-frame are portions of tie-bars of said lead frame.

* * * * *